(12) United States Patent
Enomoto et al.

(10) Patent No.: US 6,806,195 B1
(45) Date of Patent: Oct. 19, 2004

(54) MANUFACTURING METHOD OF SEMICONDUCTOR IC DEVICE

(75) Inventors: Hiroyuki Enomoto, Mitaka (JP); Kazuo Yamazaki, Kokubunji (JP); Masayuki Yasuda, Yokohama (JP)

(73) Assignees: Texas Instruments Incorporated, Dallas, TX (US); Hitachi Ltd., Tokyo (JP)

( * ) Notice: Subject to any disclaimer, the term of this patent is extended or adjusted under 35 U.S.C. 154(b) by 0 days.

(21) Appl. No.: 09/019,087

(22) Filed: Feb. 5, 1998

(30) Foreign Application Priority Data

Feb. 5, 1997 (JP) .............................................. 9-023040

(51) Int. Cl.⁷ .............................................. H01L 21/20
(52) U.S. Cl. ........................ 438/700; 438/694; 438/701
(58) Field of Search ................................. 438/700, 701, 438/694

(56) References Cited

U.S. PATENT DOCUMENTS 4,933,739 A * 6/1990 Harari ........................... 357/55
5,514,625 A * 5/1996 Tsuji ............................ 437/195
5,766,823 A * 6/1998 Fumitomo .................... 430/314
5,792,687 A   8/1998 Jeng et al. .................... 438/253

FOREIGN PATENT DOCUMENTS

JP    62-30323    *    2/1987

* cited by examiner

*Primary Examiner*—Robert Kunemund
(74) *Attorney, Agent, or Firm*—William B. Kempler; W. James Brady, III; Frederick J. Telecky, Jr.

(57) ABSTRACT

To provide a manufacturing method of the semiconductor IC device having fine-structure connecting holes or trenches with high dimensional precision. There is the following step of the operation: a hook-shaped hard mask made of polysilicon film 18 and polysilicon film 20a is formed on the surface of silica film 17 for forming connecting holes 21 accommodating plugs that perform an electrical connection with the lower portion of the lower electrode of the capacitor in the COB-type memory cells, with the hook-shaped hard mask being used as an etching mask in selective etching so as to form connecting holes 21 on silica film 17 and silica film 15 below it.

10 Claims, 8 Drawing Sheets

MANUFACTURING METHOD OF SEMICONDUCTOR IC DEVICE

FIELD OF THE INVENTION

This invention pertains to a manufacturing method of a semiconductor IC device. In particular, this invention pertains to a manufacturing method of a semiconductor IC device having connecting holes or trenches with a high dimensional precision and fine configuration.

BACKGROUND OF THE INVENTION

The present inventors have surveyed the manufacturing methods of the semiconductor IC device. The following is a summary of the technologies surveyed by the present inventors.

In DRAM (Dynamic Random Access Memory) having the so-called capacitor-over-bit line (COB) type of memory cells with capacitors for storing information set above the bit lines, after formation of the bit lines (BL), an electrical connection occurs between the lower electrodes of the capacitor (storage node electrode, storing electrode) and the semiconductor region that becomes the drain of the MOS-FET (Metal Oxide Semiconductor Field Effect Transistor) formed in the semiconductor substrate. For this purpose, connecting holes are formed on the insulating film made of silicon in the area between them.

In this case, with the progress in miniaturization, it has become more difficult to ensure the alignment tolerance between the aforementioned connecting holes and the bit lines. Consequently, studies have been performed on the technology used to form the aforementioned connecting holes in a self-aligned manner along the step of the said bit lines by covering said bit lines with a silicon nitride film, and using the silicon nitride film as an etching stopper film in the dry etching processing for forming the aforementioned connecting holes on the silicon nitride film.

For example, Japanese Kokai Patent Application No. Hei 3[1991]-214669 disclosed a type of semiconductor IC device having DRAM.

However, when the aforementioned connecting holes are formed, the silica film is dry-etched and the hole-opening property is improved. In this case, the etching selectivity for the silicon nitride film that covers the bit lines is degraded, so that the connecting holes come in contact with the bit line and the formation operation of the connecting holes becomes incomplete.

Consequently, it was once proposed that the thickness of the silicon nitride film covering the bit lines be increased. However, in this case, due to the stress of the silicon nitride film, the bit lines and the semiconductor substrate, as well as the MOSFET and various other structural elements formed on the substrate undergo deformation.

The purpose of this invention is to provide a technology that allows the formation of connecting holes and trenches having high dimensional precision and fine structure.

The aforementioned purpose and other purposes of this invention will be explained in the following with reference to the text and FIGS. of this specification.

REFERENCE NUMERALS AND SYMBOLS AS SHOWN IN THE DRAWINGS

1 represents a semiconductor substrate (substrate), 1a a trench, 2 a silica film (insulating film), 2a a trench, 2b an opening, 3 a polysilicon film (first mask film), 4 a resist film, 5 a polysilicon film (second mask film), 5a a polysilicon film (side wall), 6 a silica film (insulating film), 6a a silica film (separating film), 7 a gate insulating film, 8 a gate electrode, 9 an insulating film, 10 a side-wall insulating film (side wall spacer), 11 a gate region, 12 a semiconductor region, 13 a silica film, 14 a plug, 15 a silica film (insulating film), 16 a wiring layer, 17 a silica film (insulating film), 17a a trench, 18 a polysilicon film (first mask film), 19 a resist film, 20 a polysilicon film (second mask film), 20a a polysilicon film (side wall), 21 a connecting hole, 22 a plug, 23 a lower electrode of capacitor, 24 a dielectric film of capacitor, 25 an upper electrode of capacitor, 26 a Silica film (insulating film), 26a a trench, 27 a polysilicon film (first mask film), 28 a resist film, 29 a polysilicon film (second mask film), 29a a polysilicon film (side wall), 30 a trench, 31 an aluminum layer (electroconductive layer), 31a an aluminum layer (wiring layer).

SUMMARY OF THE INVENTION

The following is a brief explanation of the invention disclosed in this patent application.

The manufacturing method of a semiconductor IC device of this invention comprises the following steps of operation:

a step in which an insulating film is formed on a semiconductor substrate or SOI substrate;

a step in which a first mask film is formed on the aforementioned insulating film;

a step in which, after a resist film is formed on the aforementioned first mask film, the resist film is used as an etching mask to form an opening on the aforementioned first mask film, followed by the formation of trenches on the aforementioned insulating film exposed from the opening;

a step in which, after the aforementioned resist film is removed, a second mask film is formed on the aforementioned semiconductor substrate or SOI substrate;

a step in which, by removing the aforementioned second mask film such that it is left on the side walls of the aforementioned trenches, a side wall made of the aforementioned second mask film is formed on the side walls of the aforementioned trenches;

and a step in which the aforementioned first mask film and the aforementioned side wall are used as the etching mask in etching off the aforementioned insulating film exposed from the mask, so as to form connecting holes on the aforementioned insulating film.

This invention also provides a manufacturing method of semiconductor IC device, characterized by the fact that it consists of the following steps of operation:

a step in which an insulating film is formed on a semiconductor substrate or SOI substrate;

a step in which a first mask film is formed on the aforementioned insulating film;

a step in which, after a resist film is formed on the aforementioned first mask film, the resist film is used as an etching mask to form an opening on the aforementioned first mask film, followed by the formation of trenches on the aforementioned insulating film exposed from the opening;

a step in which, after the aforementioned resist film is removed, a second mask film is formed on the aforementioned semiconductor substrate or SOI substrate;

a step in which, by removing the aforementioned second mask film such that it is left on the side walls of the aforementioned trenches, a side wall made of the aforementioned second mask film is formed on the side walls of the aforementioned trenches;

a step in which the aforementioned first mask film and the aforementioned side wall are used as the etching mask in etching off the aforementioned insulating film exposed from the mask, so as to form an opening on the aforementioned insulating film, followed by the formation of separating trenches on the aforementioned semiconductor substrate or SOI substrate exposed from the opening;

and a step in which an insulating film is buried in the aforementioned separating trenches to form a separating portion.

This invention also provides a manufacturing method of a semiconductor IC device characterized by the fact that it consists of the following steps of operation:

a step in which an insulating film is formed on a semiconductor substrate or SOI substrate;

a step in which a first mask film is formed on the aforementioned insulating film;

a step in which, after a resist film is formed on the aforementioned first mask film, the resist film is used as an etching mask to form an opening on the aforementioned first mask film, followed by the formation of trenches on the aforementioned insulating film exposed from the opening;

a step in which, after the aforementioned resist film is removed, a second mask film is formed on the aforementioned semiconductor substrate or SOI substrate;

a step in which, by removing the aforementioned second mask film such that it is left on the side walls of the aforementioned trenches, a side wall made of the aforementioned second mask film is formed on the side walls of the aforementioned trenches;

and a step in which the aforementioned first mask film and the aforementioned side wall are used as the etching mask in etching off the aforementioned insulating film exposed from the mask, so as to form wiring-forming trenches on the aforementioned insulating film, followed by burying an electroconductive material in the aforementioned wiring-forming trenches to form a wiring layer made of the electroconductive material.

The following is a brief account of the typical effects of the invention disclosed in this patent application.

(1) In the manufacturing method of the semiconductor IC device of this invention, in order to make an electrical connection between the lower electrodes of the capacitors of the COB-type memory cell in DRAM and the plugs on the semiconductor region as the drain of the MOSFET formed on a semiconductor substrate or other substrate, connecting holes are formed on the silica film or other insulating film in the area between them, followed by the formation of plugs in the connecting holes.

In this case, the hook-shaped hard mask is used in performing the etching operation to form the connecting holes. Consequently, it is possible to etch and form the side surfaces of the connecting holes in the vertical direction while the pattern dimensions of the hook-shaped hard mask are maintained. As a result, even when the connecting holes are deep, it is still possible to form the connecting holes with processing dimensions finer than the processing limit in the conventional case involving the formation of connecting holes using photolithographic technology and selective etching technology without using the hook-shaped hard mask, and it is possible to form the connecting holes in fine processing with a high dimensional precision. In this case, according to studies performed by the present inventors, even when the aspect ratio of the connecting holes is 3 or larger, it is still possible to form fine-structure connecting holes having vertical side surfaces.

Consequently, it is possible to prevent the problem of contact between the connecting holes and the wiring layer as bit lines adjacent to the connecting holes, so that it is possible to provide a type of semiconductor IC device with a high performance and high manufacturing yield, as well as its manufacturing method.

(2) Using the manufacturing method of the semiconductor IC device of this invention, it is possible to form the element-separating insulating film made of silica film, etc., buried in trenches in a selected region of the semiconductor substrate or other substrate, and it is possible to form the element-separating insulating film having a plane flush with the surface of the substrate in the region of the flattened semiconductor substrate or other substrate.

In this case, the hook-shaped hard mask is used in performing the etching operation to form the opening on the insulating film in the lower portion of the hook-shaped hard mask and to form trenches on the substrate. Consequently, it is possible to etch and form the side surfaces of the opening and trenches in the vertical direction while the pattern dimensions of the hook-shaped hard mask are maintained. As a result, even when the trenches are deep, it is still possible to form the trenches with processing dimensions finer than the processing limit in the conventional case involving the formation of trenches using photolithographic technology and selective etching technology without using the hook-shaped hard mask. It is also possible to form the trenches in fine processing with a high dimensional precision.

Consequently, it is possible to form an element-separating film having fine-structure trenches, so that is it possible to provide a type of semiconductor IC device with a high performance and high manufacturing yield, as well as its manufacturing method.

(3) Using the manufacturing method of the semiconductor IC device of this invention, it is possible to form a wiring layer (damassin wiring layer) buried in the trenches on a silica film or other insulating film, and it is possible to form a wiring layer having a plane flush with the surface of the region of the flattened silica film or other insulating film.

In this case, the hook-shaped hard mask is used in performing the etching operation to form the trenches. Consequently, it is possible to etch and form the side surfaces of the trenches in the vertical direction while the pattern dimensions of the hook-shaped hard-mask are maintained. As a result, even when the trenches are deep, it is still possible to form the trenches with processing dimensions finer than the processing limit in the conventional case involving the formation of trenches using photolithographic technology and selective etching technology without using the hook-shaped hard mask, and it is possible to form the trenches in fine processing with a high dimensional precision.

Consequently, it is possible to form the wiring layer having fine-structure trenches, so that is it possible to provide a type of semiconductor IC device with a high performance and high manufacturing yield, as well as its manufacturing method.

DESCRIPTION OF EMBODIMENTS

In the following, this invention will be explained in more detail using embodiments with reference to the FIGS. The same parts numbers are adopted throughout the FIGS. for illustrating the embodiment, and no repeated explanation will be made.

FIGS. 1–23 are schematic cross-sectional views illustrating the manufacturing operation of the semiconductor IC device in an embodiment of this invention. The semiconductor IC device in this embodiment is a DRAM having capacitors of COB-type memory cells. This FIG. will be used in explaining the semiconductor IC device and its manufacturing method in the embodiment of this invention.

First of all, for example, an insulating film for element separation is formed on the surface of semiconductor substrate 1 made of p-type single-crystal silicon by burying a silica film in trenches.

Figure 1:
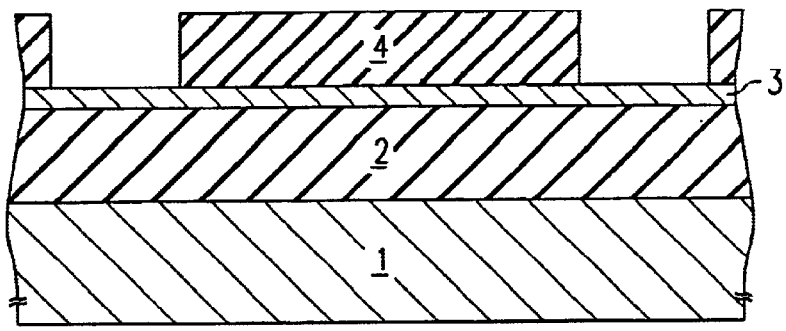
FIG. 1 is a schematic cross-sectional view illustrating a manufacturing step of the semiconductor IC device in an embodiment of this invention.

That is, on the surface of semiconductor substrate 1, the CVD (Chemical Vapor Deposition) method is adopted to form a thick silica film (insulating film) 2, followed by forming a thin polysilicon film (first mask film) 3 on silica film 2 using the CVD method. After resist film 4 is coated on semiconductor substrate 1, a pattern for forming trenches is formed using photolithographic technology. (FIG. 1).

In this case, the insulating film made of silica film 2 may have various forms, such as a SOG (Spin On Glass) film, PSG (Phospho Silicate Glass) film, BPSG (Boro Phospho Silicate Glass) film, or a laminated film made of said SOG film, PSG film, BPSG film, and silica film. Also, the first mask film for use as the hook-shaped hard mask made of polysilicon film (3) can be in the form of a silicon nitride film or other insulating film, or a tungsten film or other electroconductive film as a film made of a material for etching under conditions different from those for silica film 2 below it.

Figure 2:
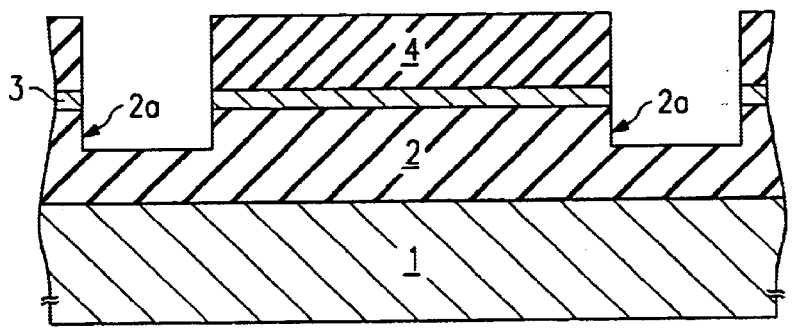
FIG. 2 is a schematic cross-sectional view illustrating a manufacturing step of the semiconductor IC device in an embodiment of this invention.

Using resist film 4 as an etching mask, polysilicon film 3 in the lower portion of the opening formed on resist film 4 is etched off by means of, e.g., a microwave dry etching device. The outer layer of silica film 2 below it is then etched by a parallel plate type of RIE (Reactive Ion Etching) device, etc., to form trenches 2a in the region (FIG. 2). In this case, the depth of trenches 2a is larger than the thickness of the polysilicon film to be explained later.

Figure 3:
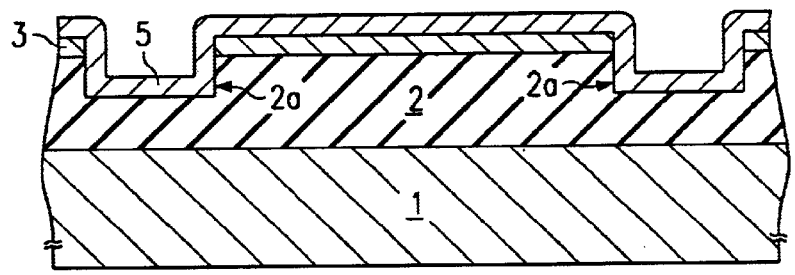
FIG. 3 is a schematic cross-sectional view illustrating a manufacturing step of the semiconductor IC device in an embodiment of this invention.
Figure 4:
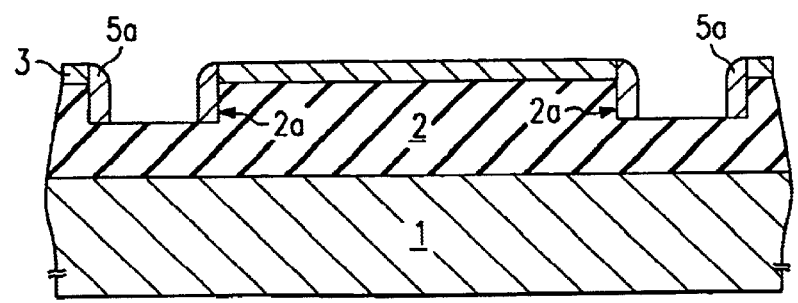
FIG. 4 is a schematic cross-sectional view illustrating a manufacturing step of the semiconductor IC device in an embodiment of this invention.

After removal of the undesired resist film 4, a polysilicon film (second mask film) 5 is formed on semiconductor substrate 1 using the CVD method, with the side surfaces of trenches 2a being covered with polysilicon film 5. (FIG. 3). In this case, polysilicon film 5 is made of the same material as that for polysilicon film 3 below it. In the operation performed afterwards, using dry etching or some other selective etching method, at least polysilicon film 5 below trenches 2a is removed, while polysilicon film (side wall) 5a on the side walls of polysillicon film 3 of the opening and the side walls of trenches is left (FIG. 4).

Figure 5:
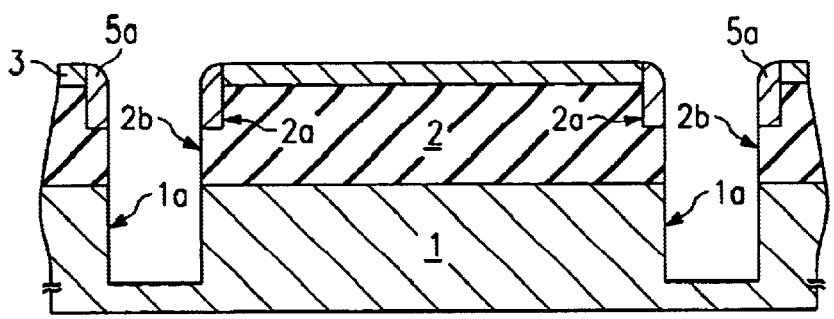
FIG. 5 is a schematic cross-sectional view illustrating a manufacturing step of the semiconductor IC device in an embodiment of this invention.

With polysilicon film 3 and polysilicon film 5 as hook-shaped hard mask films used as the etching mask, dry etching or some other selective etching is performed to form opening 2b on silica film 2, followed by the formation of trenches 1a on the semiconductor substrate 1 below it (FIG. 5). During the silicon etching operation for forming said trenches 1a, polysilicon films 3 and 5a are etched off.

Figure 6:
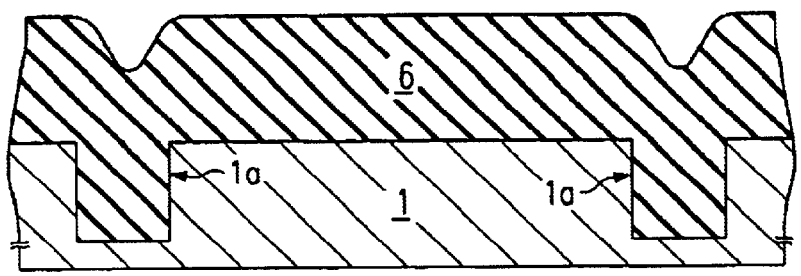
FIG. 6 is a schematic cross-sectional view illustrating a manufacturing step of the semiconductor IC device in an embodiment of this invention.

After removal of silica film 2, for example, silica film (insulating film) 6 is formed on semiconductor substrate 1 by the CVD method, etc., and silica film 6 is buried in trenches 1a (FIG. 6).

Figure 7:
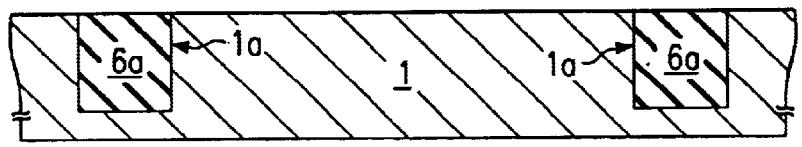
FIG. 7 is a schematic cross-sectional view illustrating a manufacturing step of the semiconductor IC device in an embodiment of this invention.

Using the CMP (Chemical Mechanical Polishing) method or other polishing method, silica film 6 other than silica film 6a buried in trenches 1a is removed and, while silica film (element separating insulating film) 6a as the field insulating film is buried in trenches 1a, the surface of semiconductor substrate 1 is flattened (FIG. 7).

In the aforementioned manufacturing operation, it is possible to form an element-separating insulating film made of silica film 6a an buried in trenches 1a on selected regions of semiconductor substrate 1, and it is possible to form silica film 6a as an element-separating insulating film flush with the surface of semiconductor substrate 1 on areas of flattened semiconductor substrate 1.

In this case, as shown in FIG. 5, polysilicon film 3 with polysilicon film 5a have the functions of a hook-shaped hard mask, with polysilicon film 5a being present on the side walls (vertical portions) of trenches 2a on silica film 2 for forming opening 2b and trenches 1b. Consequently, even when the shoulder of the hook-shaped hard mask (the joint between polysilicon film 3 and polysilicon film 5a) is etched back due to abnormal etching conditions when silica film 2 is etched, since there is the vertical portion of the hook-shaped hard mask (polysilicon film 5a on the side walls of trenches 2a), there is no change in the dimensions of the pattern of opening 2b and trenches 1a. Consequently, it is possible to form the fine-structure opening 2b and trenches 1b at a high dimensional precision. In this case, it is possible to maintain the dimensional precision of trenches 1a by means of opening 2b.

Also, as opening 2b and trenches 1a are formed using etching technology by means of the hook-shaped hard mask, it is possible to etch and form the side surfaces of opening 2b and trenches 1a in the vertical direction while the pattern dimensions of the hook-shaped hard mask are maintained. Consequently, even when trenches 1a are deep, it is still possible to form trenches 1a with processing dimensions finer than the processing limit in the conventional case involving the formation of trenches using photolithographic technology and selective etching technology without using the hook-shaped hard mask, and it is possible to form trenches 1a in a fine processing with a high dimensional precision.

Consequently, it is possible to form silica film 6a as an element-separating insulating film with fine-structure trenches 1a. This invention thus provides a type of semiconductor IC device and its manufacturing method with high performance and a high manufacturing yield.

Figure 8:
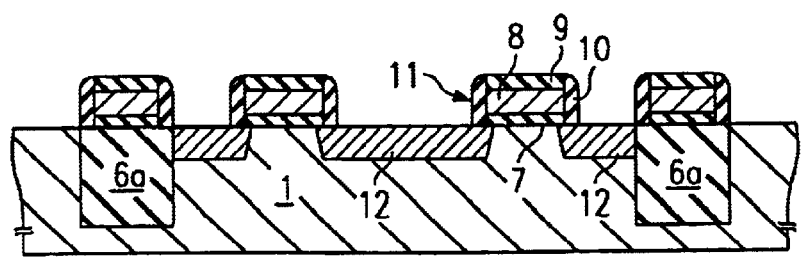
FIG. 8 is a schematic cross-sectional view illustrating a manufacturing step of the semiconductor IC device in an embodiment of this invention.

In the element-forming region of semiconductor substrate 1, MOSFETs as the structural elements of DRAM are then formed. In the same step of the operation, a wiring layer is formed using the gate electrodes of MOSFETs on silica film 6a as an element-separating insulating film (FIG. 8).

That is, after gate insulating film 7 made of a silica film is formed on semiconductor substrate 1, for example, a polysilicon film containing phosphorus as an impurity and used as gate electrode 8 is formed on said gate insulating film. On said polysilicon film, insulating film 9 consisting of, e.g., a silica film, is formed, followed by the formation of gate electrode 8 or some other pattern using photolithographic technology and selective etching technology. In this case, gate electrode 8 becomes word line (WL) of the DRAM.

After a silica film is formed on semiconductor substrate 1 using the CVD method, side wall insulating film (side wall spacer) 10 is formed on the side walls of gate electrode 8 using lithographic technology and selective etching technology. With gate region 11 made of gate electrode 8, etc., used as a mask, the ion implanting method is adopted to implant phosphorus ions or other n-type impurity ions into semiconductor substrate 1, followed by thermal diffusion processing to form a source and drain as semiconductor region 12.

Figure 9:
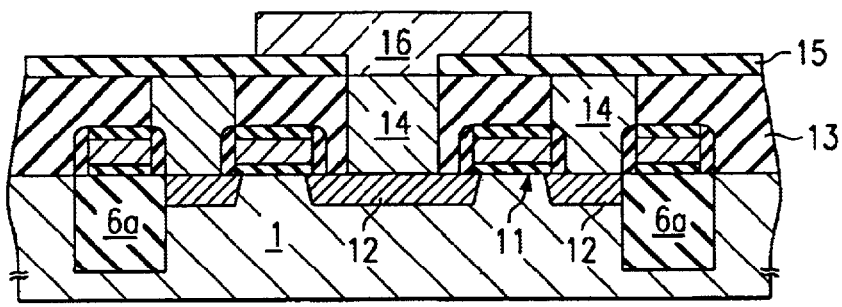
FIG. 9 is a schematic cross-sectional view illustrating a manufacturing step of the semiconductor IC device in an embodiment of this invention.

After silica film 13 is formed on semiconductor substrate 1, connecting holes are formed on silica film 13. Plugs 14 made of, e.g., electroconductive polysilicon or tungsten, are formed in the connecting holes by the selective CVD method. After an insulating film, such as silica film 15, is formed on semiconductor substrate 1 and connecting holes are formed on silica film 15, for example, an electroconductive polysilicon film is formed on semiconductor substrate 1 and, by means of the lithographic technology and selective etching technology, the polysilicon film is patterned to form wiring layer 16 as the bit lines (BL) (FIG. 9). In this case, in order to improve plugs 14 and the polysilicon film, if needed, another electroconductive layer may be included.

In order to form an electrical connection between the lower electrode (storage node electrode, storage electrode) of the capacitors in the COB-type memory cells in the DRAM and plug 14 on semiconductor region 12 as the drain of the MOSFET formed on semiconductor substrate 1, a manufacturing step is performed in which connecting holes are formed on the insulating film, including silica film 15, in the area between them.

Figure 10:
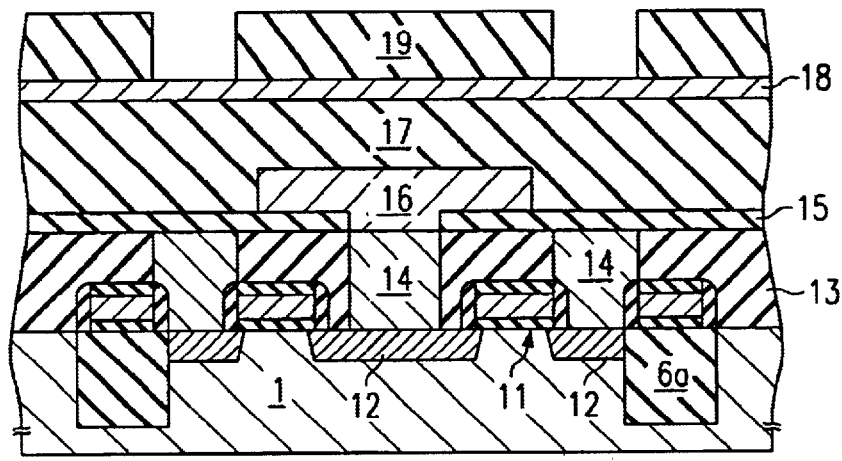
FIG. 10 is a schematic cross-sectional view illustrating a manufacturing step of the semiconductor IC device in an embodiment of this invention.

That is, after a thick silica film (insulating film) 17 is formed using the CVD method on the surface of semiconductor substrate 1, the CVD method is used to form thin polysilicon film (first mask film) 18 on silica film 17. After resist film 19 is coated on semiconductor substrate 1, lithographic technology is adopted to produce a pattern for forming the connecting holes on resist film 19 (FIG. 10). In this case, the insulating film made of silica film 17 may be in any of the following various forms: SOG film, PSG film, BPSG film, or a laminated film made of said SOG film, PSG film, BPSG film, and silica film. Also, the first mask film for use as the hook-shaped hard mask made of polysilicon film 18 may be in the form of a silicon nitride film or other insulating film, or a tungsten film or other electroconductive film, that is, a film made of a material with etching conditions different from those of silica film 17 below it.

Figure 11:
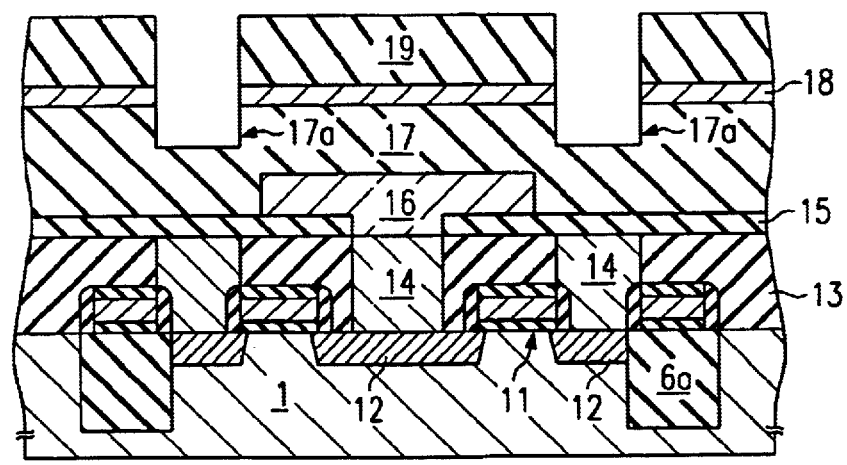
FIG. 11 is a schematic cross-sectional view illustrating a manufacturing step of the semiconductor IC device in an embodiment of this invention.

After etching off polysilicon film 18 in the lower portion of the opening formed on resist film 19 using resist film 19 as an etching mask, the outer layer of silica film 17 below the polysilicon film is etched, with trenches 17a being formed in this area (FIG. 11). In this case, the depth of trenches 17a is selected to be larger than the thickness of the polysilicon film to be explained later, and, as long as no contact is made to be with wiring layer 16 as bit lines, the depth is selected as large as possible.

Figure 12:
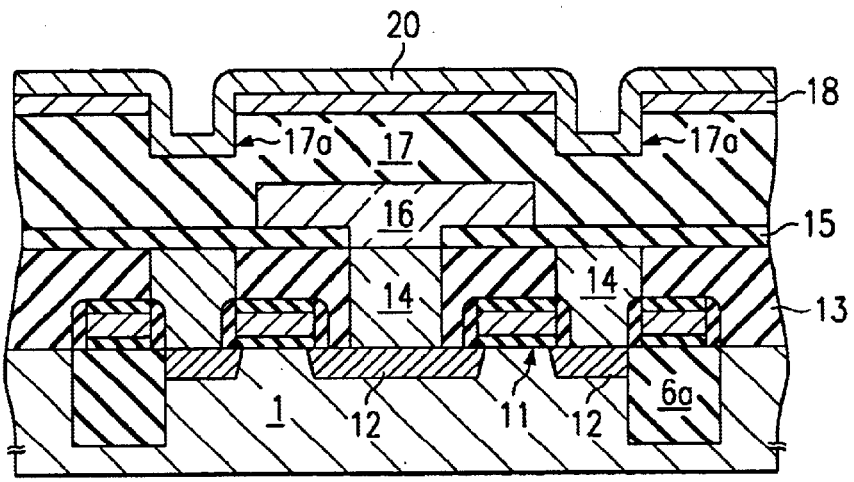
FIG. 12 is a schematic cross-sectional view illustrating a manufacturing step of the semiconductor IC device in an embodiment of this invention.

After removal of the undesired resist film 19, thin polysilicon film (second mask film) 20 is formed on semiconductor substrate 1 using the CVD method, and the side surfaces of trenches 17a are covered with polysilicon film 20 (FIG. 12).

Figure 13:
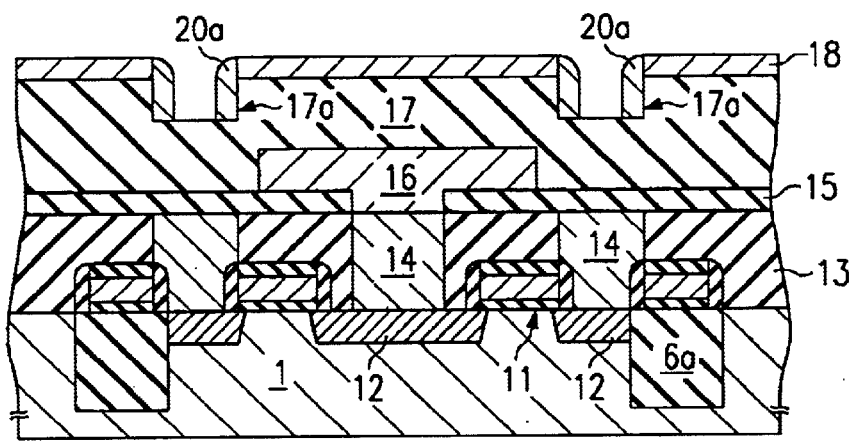
FIG. 13 is a schematic cross-sectional view illustrating a manufacturing step of the semiconductor IC device in an embodiment of this invention.

At least polysilicon film 20 below trenches 17a is removed using the dry etching or other selective etching method, while polysilicon film (side wall) 20a is left on the side walls of polysilicon film 18 of the opening and on the side walls of trenches 17a (FIG. 13).

Figure 14:
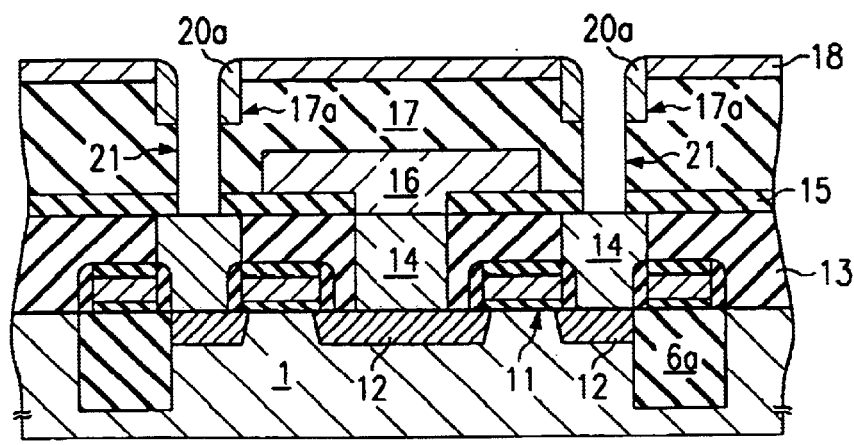
FIG. 14 is a schematic cross-sectional view illustrating a manufacturing step of the semiconductor IC device in an embodiment of this invention.

Polysilicon film 18 and polysilicon film 20a as a hook-shaped hard mask are used as an etching mask to perform a dry etching or other selective etching operation to form connecting holes (also known as through-holes or contact holes) 21 on silica film 17 and silica film 15 below silica film 17 (FIG. 14).

Figure 15:
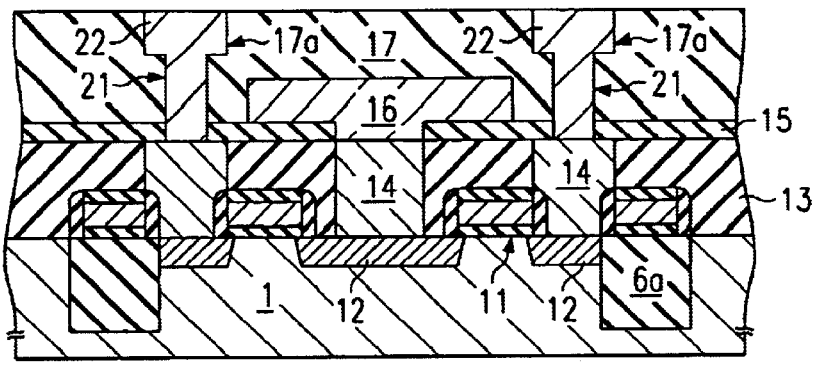
FIG. 15 is a schematic cross-sectional view illustrating a manufacturing step of the semiconductor IC device in an embodiment of this invention.

Plugs 22 made of electroconductive polysilicon or tungsten are then formed using the selective CVD method in connecting holes 21 (FIG. 15). This is based on the following reasons ① and ②. ① While plugs 22 are formed (such as CMP), [they] are removed at the same time. ② When plugs 14 are made of polysilicon, [they are removed] as polysilicon [films] 18 and 20a are removed. For said plugs 22, for example, the diameter in the upper portion of wiring layer 16 for bit lines is larger than that in the lower portion. In this case, when a silicon nitride film or other insulating film is used in place of polysilicon film 18 and polysilicon film 20a, it is possible to omit the operation used to remove the insulating film corresponding to the design specifications.

In the aforementioned manufacturing operation, in order to realize the electrical connection between the lower electrode of the capacitor of the COB-type memory cell in the DRAM and plug 14 on semiconductor region 12 as the drain of the MOSFET formed on semiconductor substrate 1, it is possible to perform the following operation: after formation of connecting hole 21 on the insulating film made of silica film 15 and silica film 17 in the area between them, plug 22 is formed in connecting hole 21.

In this case, polysilicon film 18 and polysilicon film 20a have the function of the hook-shaped hard mask, with polysilicon film 20a being present on the side walls (vertical portion) of trenches 17a of silica film 17 for forming connecting holes 21. Consequently, even when the shoulder of the hook-shaped hard mask (the joint between polysilicon film 18 and polysilicon film 20a) is etched back due to abnormal etching conditions when silica film 17 is etched, since there is the vertical portion of the hook-shaped hard mask (polysilicon film 20a on the side walls of trenches 17a), there is no change in the dimensions of the pattern of connecting hole 21, and it is possible to form fine-structure connecting holes 21 with a high dimensional precision.

Also, as connecting holes 21 are formed using etching technology by means of the hook-shaped hard mask, it is possible to etch and form the side surfaces of connecting holes 21 in the vertical direction while the pattern dimensions of the hook-shaped hard mask are maintained. Consequently, even when connecting holes 21 are deep, it is still possible to form connecting holes 21 with processing dimensions finer than the processing limit in the conventional case involving the formation of connecting holes using photolithographic technology and selective etching technology without using the hook-shaped hard mask. It is also possible to form connecting holes 21 in fine processing with a high dimensional precision. In this case, according to studies performed by the present inventors, even when the aspect ratio of connecting holes 21 is 3 or larger, it is possible to form fine-structure connecting holes 21 having vertical side surfaces.

Consequently, it is possible to prevent the problem of contact between connecting holes 21 and wiring layer 16 as bit lines adjacent to connecting holes, so that it is possible to provide a type of semiconductor IC device with a high performance and high manufacturing yield, as well as its manufacturing method.

Figure 16:
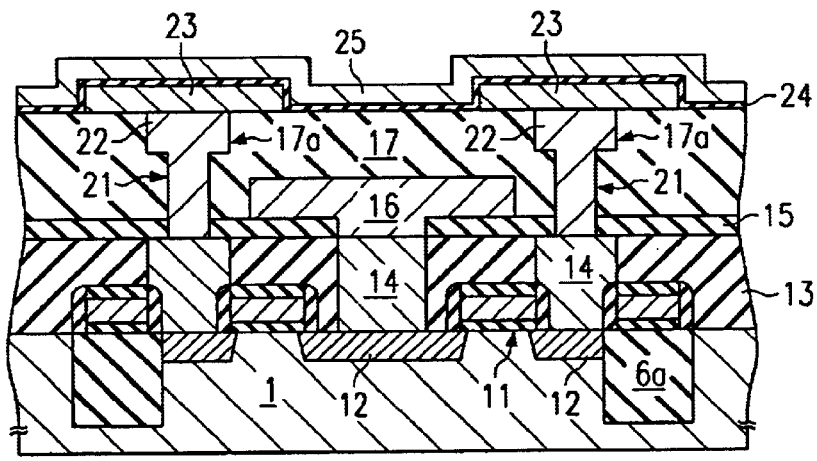
FIG. 16 is a schematic cross-sectional view illustrating a manufacturing step of the semiconductor IC device in an embodiment of this invention.

Capacitors in COB memory cells are then formed on semiconductor substrate 1 (FIG. 16). In this case, an electrical connection is made between the lower electrode (known as the storage node electrode or storage electrode) 23 of the capacitor and plug 22, a dielectric film 24 is formed on it, and upper electrode (plate electrode) 25 is formed on said dielectric film 24.

That is, first of all, lower electrode 23 of the capacitor is formed. The formation of lower electrode 23 is carried out by depositing an electroconductive polysilicon film containing phosphorus or some other impurity on semiconductor substrate 1 by means of the CVD method, followed by patterning using photolithographic technology and selective etching technology.

Dielectric film 24 is then deposited on semiconductor substrate 1 containing lower electrode 23. As dielectric film 24, for example, $Si_3N_4$ (silicon nitride), $Ta_2O_5$ (tantalum pentaoxide) or ferrodielectric film PZT (lead zirconate-titanate), etc., is deposited. Other forms of dielectric film 24 that can be adopted include strontium titanate, lead titanate, barium titanate, and other titanium compounds, as well as other dielectric films.

Upper electrode 25 of the capacitor is then formed on semiconductor substrate 1. Upper electrode 25 is formed by deposing an electroconductive polysilicon film containing phosphorus or some other impurity on semiconductor substrate 1 using the CVD method, followed by patterning using photolithographic technology and selective etching technology.

On semiconductor substrate 1, silica film 26 is then formed as an insulating film, and a wiring layer made of, e.g., aluminum, is formed with trenches (trenches for damassin [unconfirmed translation] wiring) formed and buried on its surface.

That is, after a thick silica film (insulating film) 26 is formed using the CVD method on semiconductor substrate 1, a thin polysilicon film (first mask film) 27 is formed using the CVD method on said silica film 26. After resist film 28 is coated on semiconductor substrate 1, photolithographic technology is adopted to form a pattern on resist film 28 to form trenches (trenches for damassin wiring).

In this case, the forms of the insulating film made of silica film 26 include a SOG film, PSG film, BPSG film, or a laminated film made of said SOG film, PSG film, BPSG film, and silica film. Also, the first mask film for use as the hook-shaped hard mask made of polysilicon film 27 may be in the form of a silicon nitride film or other insulating film, or a tungsten film or other electroconductive film, that is, a film made of a material with etching conditions different from those of silica film 26 below it.

Figure 17:
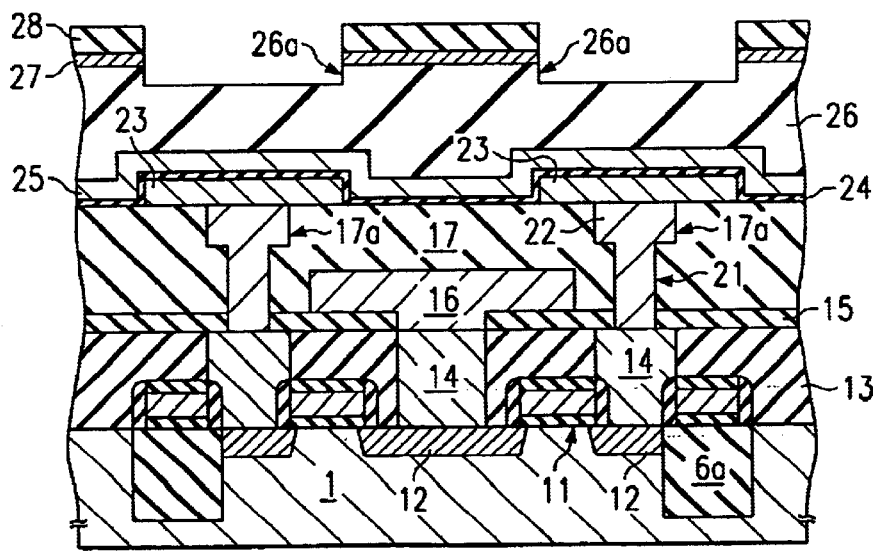
FIG. 17 is a schematic cross-sectional view illustrating a manufacturing step of the semiconductor IC device in an embodiment of this invention.

After etching off polysilicon film 27 in the lower portion of the opening formed on resist film 28 using resist film 28 as an etching mask, the outer layer of silica film 26 below the polysilicon film is etched, with trenches 26a being formed in this area (FIG. 17). In this case, the depth of trenches 26a is selected to be larger than the thickness of the polysilicon film to be explained later.

Figure 18:
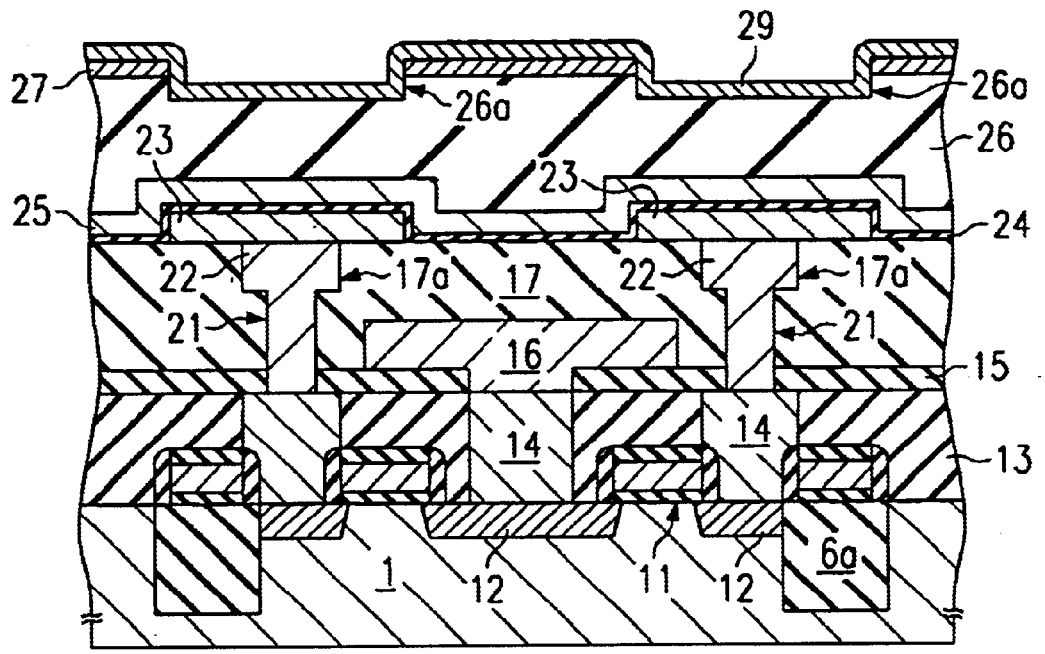
FIG. 18 is a schematic cross-sectional view illustrating a manufacturing step of the semiconductor IC device in an embodiment of this invention.
Figure 19:
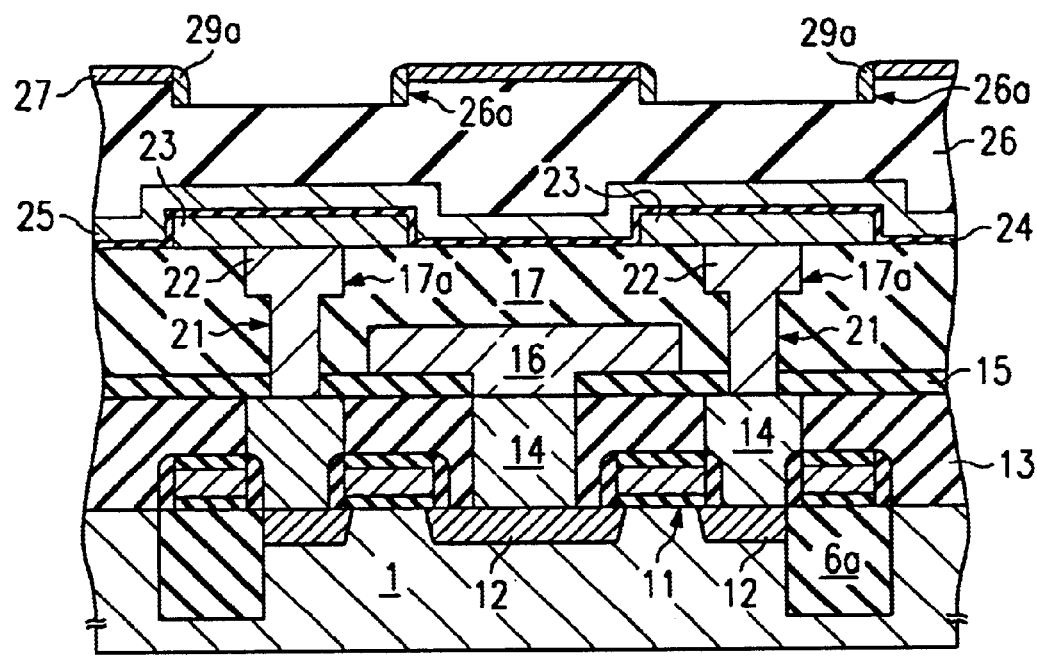
FIG. 19 is a schematic cross-sectional view illustrating a manufacturing step of the semiconductor IC device in an embodiment of this invention.

After removal of undesired resist film 28, thin polysilicon film (second mask film) 29 is formed on semiconductor substrate 1 using the CVD method, and the side surfaces of trenches 26a are covered with polysilicon film 29 (FIG. 18). In this case, polysilicon film 29 is made of the same material as that of polysilicon film 27. Then, at least polysilicon film 29 below trenches 26a is removed using the dry etching or other selective etching method, while polysilicon film (side wall) 29a is left on the side walls of polysilicon film 27 of the opening and on the side walls of trenches 26a (FIG. 19).

Figure 20:
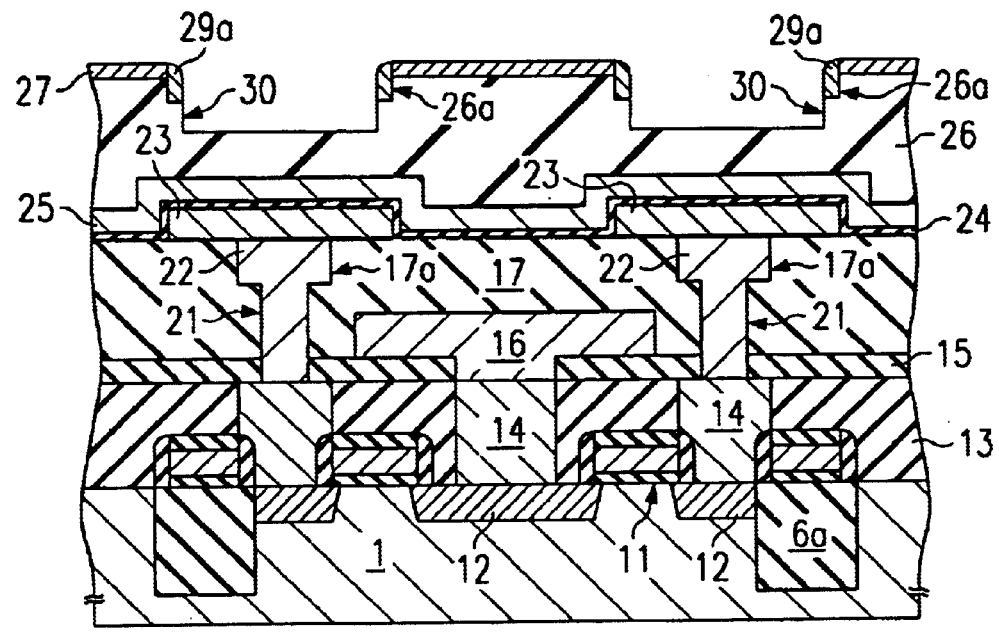
FIG. 20 is a schematic cross-sectional view illustrating a manufacturing step of the semiconductor IC device in an embodiment of this invention.

Polysilicon film 27 and polysilicon film 29a as a hook-shaped hard mask are then used as an etching mask to perform a dry etching or other selective etching operation to form trenches 30 on silica film 26 (FIG. 20).

Figure 21:
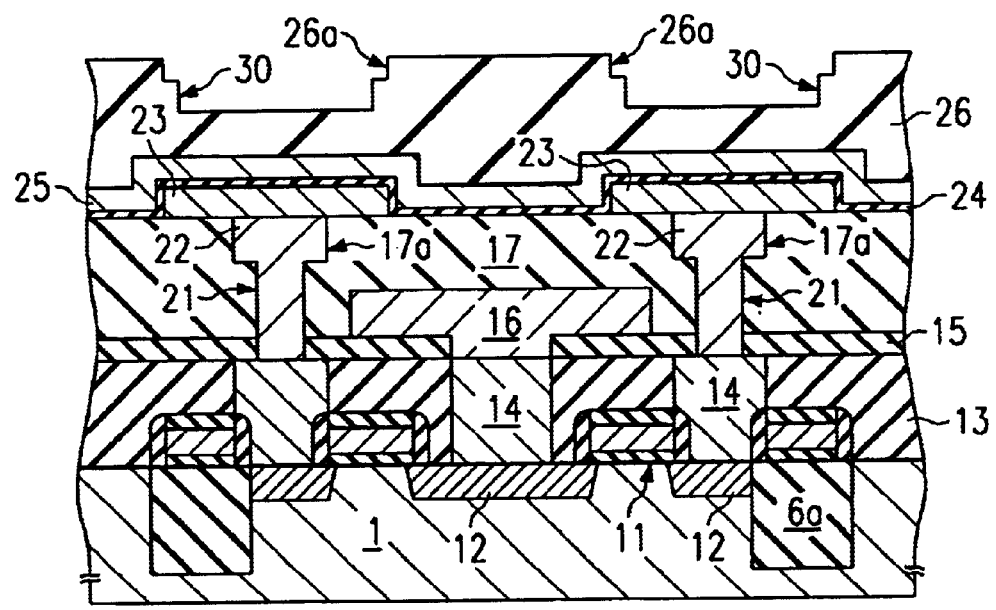
FIG. 21 is a schematic cross-sectional view illustrating a manufacturing step of the semiconductor IC device in an embodiment of this invention.
Figure 22:
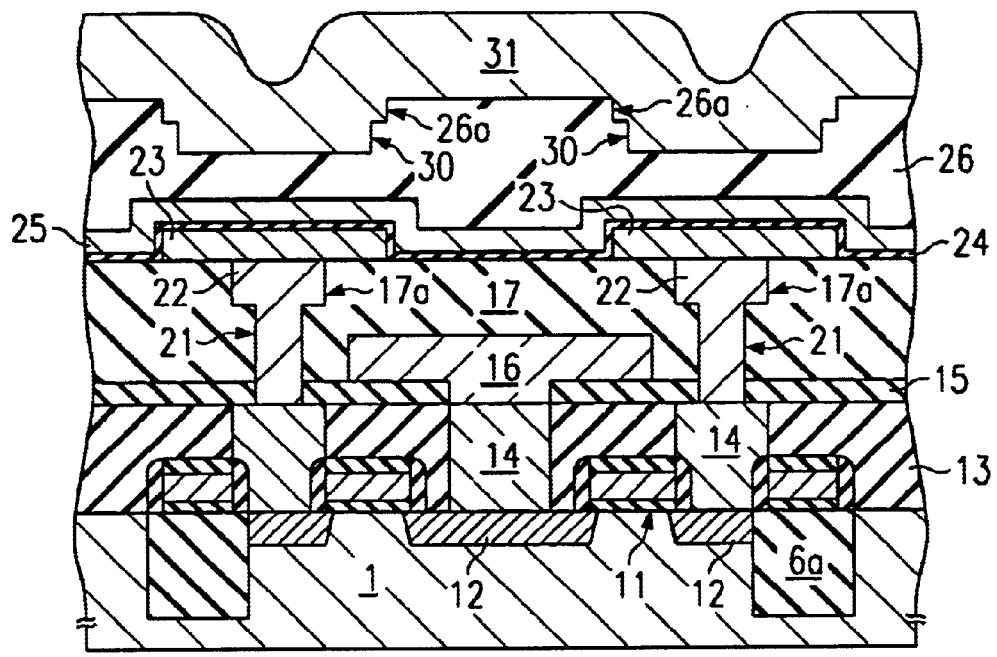
FIG. 22 is a schematic cross-sectional view illustrating a manufacturing step of the semiconductor IC device in an embodiment of this invention.

Undesired polysilicon film 27 and polysilicon film 29a are removed, making it possible to bury a wiring layer in trenches 30 formed on silica film 26 (FIG. 21). Later, for example, aluminum layer (electroconductive layer) 31 is formed on semiconductor substrate 1 by the sputtering method, then an operation is performed to bury aluminum layer 31 in trenches 30 (FIG. 22).

Figure 23:
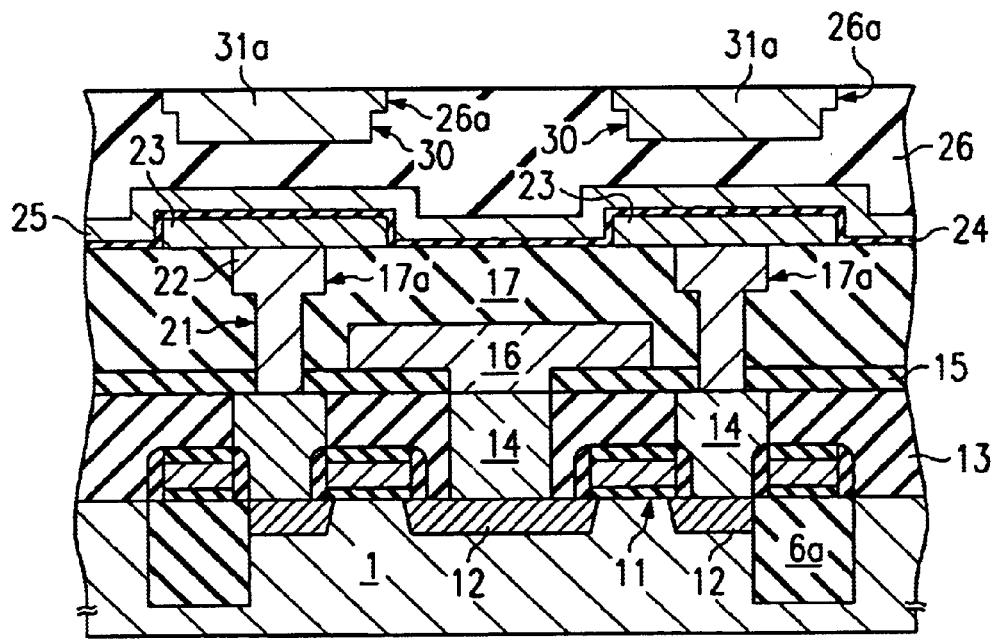
FIG. 23 is a schematic cross-sectional view illustrating a manufacturing step of the semiconductor IC device in an embodiment of this invention.

Using the CMP method or other polishing technology, aluminum layer 31 other than aluminum layer 31a buried in trenches 30 is removed, with aluminum layer 31a as a wiring layer being formed buried in trenches 30a (FIG. 23).

In the aforementioned manufacturing step, it is possible to form the wiring layer (damassin wiring layer) made of aluminum layer 31a buried in trenches 30 on silica film 26; it is also possible to form aluminum layer 31a as a wiring layer flush with the surface of silica film 26 in the region of flattened silica film 26. That is, because it is possible to flatten the upper layer of aluminum layer 31a that forms the wiring layer, it is possible to increase the pattern formation precision and flatness of the wiring formed on said upper layer. Consequently, the reliability of the wiring can be improved.

In this case, as shown in FIG. 20, polysilicon film 27 and polysilicon film 29a have the functions of a hook-shaped hard mask, with polysilicon film 29a being present on the side walls (vertical portions) of trenches 26a on silica film 26 for forming trenches 30. Consequently, even when the shoulder of the hook-shaped hard mask (the joint between polysilicon film 27 and polysilicon film 29a) is etched back due to abnormal etching conditions when silica film 26 is etched, since there is the vertical portion of the hook-shaped hard mask (polysilicon film 29a on the side walls of trenches 26a), there is no change in the dimensions of the pattern of trenches 30. Consequently, it is possible to form the fine-structure trenches 30 at a high dimensional precision.

Also, as trenches 30a are formed using etching technology by means of a hook-shaped hard mask, it is possible to etch and form the side surfaces of trenches 30 in the vertical direction while the pattern dimensions of the hook-shaped hard mask are maintained. Consequently, even when trenches 30 are deep, it is still possible to form trenches 30 with processing dimensions finer than the processing limit in the conventional case involving the formation of trenches using photolithographic technology and selective etching technology without using the hook-shaped hard mask, and it is possible to form trenches 30 in fine processing with a high dimensional precision.

Consequently, it is possible to form aluminum layer 31a as a wiring layer with fine-structure trenches 30. Consequently, this invention provides a type of semiconductor IC device and its manufacturing method with a high performance and high manufacturing yield.

After the formation of a laminated wiring layer on semiconductor substrate 1 as needed, a passivation film (not shown in the FIG.) is formed on it, completing the manufacturing operation of the semiconductor IC device having DRAM.

For the semiconductor IC device and its manufacturing method with the aforementioned form in this embodiment, in order to form an electrical connection between the lower electrode 23 of the capacitor in the COB-type memory cell in the DRAM and plug 14 on semiconductor region 12 as the drain of MOSFET formed on semiconductor substrate 1, connecting hole 21 is formed on the insulating film made of silica film 15 and silica film 17 in the area between them, followed by the formation of plug 22 in connecting hole 21.

In this case, polysilicon film 18 and polysilicon film 20a have the functions of a hook-shaped hard mask, with polysilicon film 20a being present on the side walls (vertical portions) of trenches 17a on silica film 17 for forming connecting holes 21. Consequently, even when the shoulder of the hook-shaped hard mask (the joint between polysilicon film 18 and polysilicon film 20a) is etched back due to abnormal etching conditions when silica film 17 is etched, since there is the vertical portion of the hook-shaped hard mask (polysilicon film 20a on the side walls of trenches 17a), there is no change in the dimensions of the pattern of connecting holes 21. Consequently, it is possible to form the fine-structure connecting holes 21 at a high dimensional precision.

Also, as connecting holes 21 are formed using the etching technology by means of a hook-shaped hard mask, it is possible to etch and form the side surfaces of connecting holes 21 in the vertical direction while the pattern dimensions of the hook-shaped hard mask are maintained. Consequently, even when connecting holes 21 are deep, it is still possible to form connecting holes 21 with processing dimensions finer than the processing limit in the conventional case involving the formation of connecting holes using photolithographic technology and selective etching technology without using the hook-shaped hard mask. It is also possible to form connecting holes 21 in a fine processing with a high dimensional precision. In this case, based on the studies performed by the present inventors, even when the aspect ratio of connecting holes 21 is 3 or larger, it is still possible to form fine-structure connecting holes 21 having vertical side surfaces.

Consequently, it is possible to prevent problems caused by contact between connecting holes 21 and wiring layer 16 as the bit lines adjacent to them. As a result, this manufacturing method can form semiconductor IC devices with a high performance and high manufacturing yield.

Also, for the aforementioned semiconductor IC device and its manufacturing method as an embodiment of this invention, it is possible to form the element-separating insulating film made of silica film 6a buried in trenches 1a; it is also possible to form silica film 6a as element-separating insulating film flush with the surface of semiconductor substrate 1 in the area of flattened semiconductor substrate 1.

In this case, polysilicon film 3 and polysilicon film 5a have the functions of a hook-shaped hard mask, and polysilicon film 5a is present on the side walls (vertical portions) of trenches 2a on silica film 2 for forming connecting-type opening 2b and trenches 1a. Consequently, even when the shoulder of the hook-shaped hard mask (the joint between polysilicon film 3 and polysilicon film 5a) is etched back due to abnormal etching conditions when silica film 2 is etched, since there is the vertical portion of the hook-shaped hard mask (polysilicon film 5a on the side walls of trenches 2a), there is no change in the dimensions of the pattern of opening 2b and trenches 1a. Consequently, it is possible to form the fine-structure opening portion 2b and trenches 1a at a high dimensional precision.

Also, as opening 2b and trenches 1a are formed using etching technology by means of a hook-shaped hard mask, it is possible to etch and form the side surfaces of opening 2b and trenches 1a in the vertical direction while the pattern dimensions of the hook-shaped hard mask are maintained. Consequently, even when trenches 1a are deep, it is still possible to form trenches 1a with processing dimensions finer than the processing limit in the conventional case involving the formation of trenches using photolithographic technology and selective etching technology without using the hook-shaped hard mask; it is also possible to form trenches 1a in a fine processing with a high dimensional precision.

Consequently, it is possible to form silica film 6a as an element-separating insulating film having fine-structure trenches 1a. As a result, this manufacturing method can form semiconductor IC devices with a high performance and high manufacturing yield.

Also, for the aforementioned semiconductor IC device and its manufacturing method as an embodiment of this invention, it is possible to form the wiring layer (damassin wiring layer) made of silica film 31a buried in trenches 30 on silica film 26; it is also possible to form aluminum layer 31a as the wiring layer flush with the surface of silica film 26 in the area of flattened silica film 26.

In this case, polysilicon film 27 and polysilicon film 29a have the functions of a hook-shaped hard mask, with polysilicon film 29a being present on the side walls (vertical portions) of trenches 26a on silica film 26 for forming trenches 30. Consequently, even when the shoulder of the hook-shaped hard mask (the joint between polysilicon film 27 and polysilicon film 29a) is etched back due to abnormal etching conditions when silica film 26 is etched, since there is the vertical portion of the hook-shaped hard mask (polysilicon film 29a on the side walls of trenches 26a), there is no change in the dimensions of the pattern of trenches 30. Consequently, it is possible to form the fine-structure trenches 30 at a high dimensional precision.

Also, because trenches 30 are formed using etching technology by means of a hook-shaped hard mask, it is possible to etch and form the side surfaces of trenches 30 in the vertical direction while the pattern dimensions of the hook-shaped hard mask are maintained. Consequently, even when trenches 30 are deep, it is still possible to form trenches 30 with processing dimensions finer than the processing limit in the conventional case involving the formation of trenches using photolithographic technology and selective etching technology without using the hook-shaped hard mask; it is also possible to form trenches 30 in fine processing with a high dimensional precision.

Consequently, it is possible to form aluminum [layer] 31a as a wiring layer having fine-structure trenches 30. As a result, this manufacturing method can form semiconductor IC devices with a high performance and high yield.

In the aforementioned, a detailed explanation has been given on the embodiment of the invention realized by the present inventors. However, this invention is not limited to the aforementioned embodiment, and various changes can be made as long as the main points are observed.

For example, the semiconductor IC device and its manufacturing method of this invention may be adopted in a semiconductor IC device, and its manufacturing method, in a form having at least one type of the element-separating insulating film buried in the trenches and a wiring layer buried in connecting holes or trenches, or a combination of them.

In addition to DRAM, the semiconductor IC device and its manufacturing method of this invention can also be adopted for various other types of semiconductor IC devices, such as logic or SRAM (Static Random Access Memory) and other memory devices having MOSFET, CMOSFET, BiCOMSFET, and other structural elements, as well as their manufacturing methods.

Also, for the semiconductor IC device and its manufacturing method of this invention, it is possible to use an SOI substrate or other substrate with the semiconductor layer for forming elements arranged on an insulating film in place of the semiconductor substrate for forming the semiconductor elements, and this invention can be adopted in semiconductor IC devices in the form of combinations of various semiconductor elements, such as MOSFET, CMOSFET, bipolar transistors, etc., and their manufacturing methods.

What is claimed is:

1. A manufacturing method of a semiconductor IC device, comprising the following steps:

forming an insulating film on a semiconductor substrate or SOI substrate;

forming a first mask film on the insulating film;

forming a resist film on the first mask film, the resist film being used as an etching mask to form an opening on the first mask film, followed by the formation of trenches on the insulating film exposed from the opening;

forming, after the resist film is removed, a second mask film on the semiconductor substrate or SOI substrate, said second mask film covering side walls and a bottom of the trenches;

removing the second mask film from the bottom of the trenches without removing the second mask film on the side walls of the trenches, forming a side wall made of the second mask film on the side walls of the trenches;

and using the first mask film and the second mask film as the etching mask in etching said trenches deeper than a thickness of said insulating film so as to penetrate into a portion of said substrate to form connecting holes.

2. A manufacturing method of a semiconductor IC device comprising the following steps:

forming an insulating film on a semiconductor substrate or SOI substrate;

forming a first mask film on the insulating film;

forming a resist film on the first mask film, the resist film being used as an etching mask to form an opening on the first mask film, followed by the formation of trenches on the insulating film exposed from the opening;

forming, after the resist film is removed, a second mask film on the semiconductor substrate or SOI substrate, said second mask film covering side walls and a bottom of the trenches;

removing the second mask film from the bottom of the trenches without removing the second mask film on the side walls of the trenches, forming a side wall made of the second mask film on the side walls of the trenches;

using the first mask film and the second mask film as the etching mask in etching said trenches deeper than a thickness of said insulating film so as to penetrate into a portion of said substrate to form an opening on the insulating film, followed by the formation of separating trenches on the semiconductor substrate or SOI substrate exposed from the opening;

burying an insulating film in the separating trenches to form a separating portion.

3. A manufacturing method of a semiconductor IC device comprising the following steps:

forming an insulating film on a semiconductor substrate or SOI substrate;

forming a first mask film on the insulating film;

forming a resist film on the first mask film, the resist film being used as an etching mask to form an opening on the first mask film, followed by the formation of trenches on the insulating film exposed from the opening;

forming, after the resist film is removed, a second mask film on the semiconductor substrate or SOI substrate, said second mask film covering side walls and a bottom of the trenches;

removing the second mask film from the bottom of the trenches without removing the second mask film on the side walls of the trenches, forming a side wall made of the second mask film on the side walls of the trenches;

and using the first mask film and the second mask film as the etching mask in etching said trenches deeper than a thickness of said insulating film so as to penetrate into a portion of said substrate to form wiring-forming trenches on the insulating film, followed by burying an electroconductive material in the wiring-forming trenches to form a wiring layer made of the electroconductive material.

4. The manufacturing method described in claim 1, wherein the insulating film is selected from the group consisting of a silica film, SOG film, PSG film, BPSG film, or a lamination consisting of these films, the first mask film and second mask film for the hook-shaped hard mask being selected from the group consisting of a polysilicon film, tungsten film, or other electroconductive film, or a silicon nitride film or other insulating film.

5. The manufacturing method of a semiconductor IC device described in claim 1, wherein the connecting holes are in contact with the lower electrodes in the capacitors of the memory cells, with the capacitors being set for storing information on the bit lines.

6. The manufacturing method of a semiconductor IC device described in claim 4, wherein the connecting holes are in contact with the lower electrodes in the capacitors of the memory cells, with the capacitors being set for storing information on the bit lines.

7. The manufacturing method described in claim 2, wherein the insulating film is selected from the group consisting of a silica film, SOG film, PSG film, BPSG film, or a lamination consisting of these films, the first mask film and second mask film for hook-shaped hard mask being selected from the group consisting of a polysilicon film, tungsten film, or other electroconductive film, or a silicon nitride film or other insulating film.

8. The manufacturing method of a semiconductor IC device described in claim 7, wherein the connecting holes are in contact with the lower electrodes in the capacitors of the memory cells, with the capacitors being set for storing information on the bit lines.

9. The manufacturing method described in claim 3, wherein the insulating film is selected from the group consisting of a silica film, SOG film, PSG film, BPSG film, or a lamination consisting of these films, the first mask film and second mask film for hook-shaped hard mask being selected from the group consisting of a polysilicon film, tungsten film, or other electroconductive film, or a silicon nitride film or other insulating film.

10. The manufacturing method of a semiconductor IC device described in claim 9, wherein the connecting holes are in contact with the lower electrodes in the capacitors of the memory cells, with the capacitors being set for storing information on the bit lines.

* * * * *